United States Patent [19]

Jetter et al.

[11] Patent Number: 4,537,838
[45] Date of Patent: Aug. 27, 1985

[54] SYSTEM WITH SEVERAL PANELS CONTAINING PHOTOELECTRIC ELEMENTS FOR THE PRODUCTION OF ELECTRIC CURRENT

[75] Inventors: Rudolf Jetter; Heinz Jetter, both of Feldmeilen, Switzerland

[73] Assignee: Hartag AG, Basel, Switzerland

[21] Appl. No.: 598,278

[22] PCT Filed: Jul. 5, 1983

[86] PCT No.: PCT/CH83/00088
§ 371 Date: Mar. 5, 1984
§ 102(e) Date: Mar. 5, 1984

[87] PCT Pub. No.: WO84/00253
PCT Pub. Date: Jan. 19, 1984

[30] Foreign Application Priority Data

Jul. 5, 1982 [CH] Switzerland .......... 4069/82
Sep. 28, 1982 [CH] Switzerland .......... 5694/82

[51] Int. Cl.$^3$ .............. H01M 12/00; H01L 31/06
[52] U.S. Cl. .................. 429/9; 136/244; 136/245; 136/251
[58] Field of Search .......... 136/244, 245, 292, 251; 429/9

[56] References Cited

U.S. PATENT DOCUMENTS

| | | | |
|---|---|---|---|
| 3,459,391 | 2/1964 | Haynos | 244/173 |
| 3,620,847 | 11/1971 | Wise | 136/244 |
| 3,627,585 | 12/1971 | Dollery et al. | 136/245 |
| 3,783,029 | 1/1974 | Dillard et al. | 136/245 |
| 4,219,926 | 9/1980 | Bloch et al. | 29/832 |

FOREIGN PATENT DOCUMENTS

| | | | |
|---|---|---|---|
| 2042420 | 3/1972 | Fed. Rep. of Germany | 136/245 |
| 2350696 | 2/1977 | France | 136/244 |

OTHER PUBLICATIONS

F. C. Treble, Cont. Record, *8th IEEE Photovoltaic Specialists Conf.*, (1970), pp. 319-325.

*Primary Examiner*—Aaron Weisstuch
*Attorney, Agent, or Firm*—Browdy and Neimark

[57] ABSTRACT

Several panels (5) having the same size and comprising a significant number of electrically interconnected photoelectric elements (2) are arranged side by side, separated from one another, in a compartmented folding pocket (1) open at one side and consisting of flexible insulating material. Each panel (5) is in electrical contact with connection strips (7, 12) incorporated in the material of the compartmented folding pocket (1), which extend along the longitudinal edges of the compartmented folding pocket (1) by means of solder strips (3, 4). The connection strips (7, 12) consist of a flexible metal fabric and form a series and/or parallel connection of the panels (5). Corresponding voltages at the associated currents may be tapped at contact elements (6, 6', 13, 14). At the same time, these elements mechanically hold in place the solder strips (3, 4) of the panels (5) with the connection strips (7, 12) and the material of the compartmented folding pocket (1). These panels (5) are thus interconnected without using wires. Furthermore, it is possible to transport the interconnected panels conveniently and safely in the folded condition of the compartmented folding pocket. Moreover, the panels can be readily replaced.

13 Claims, 13 Drawing Figures

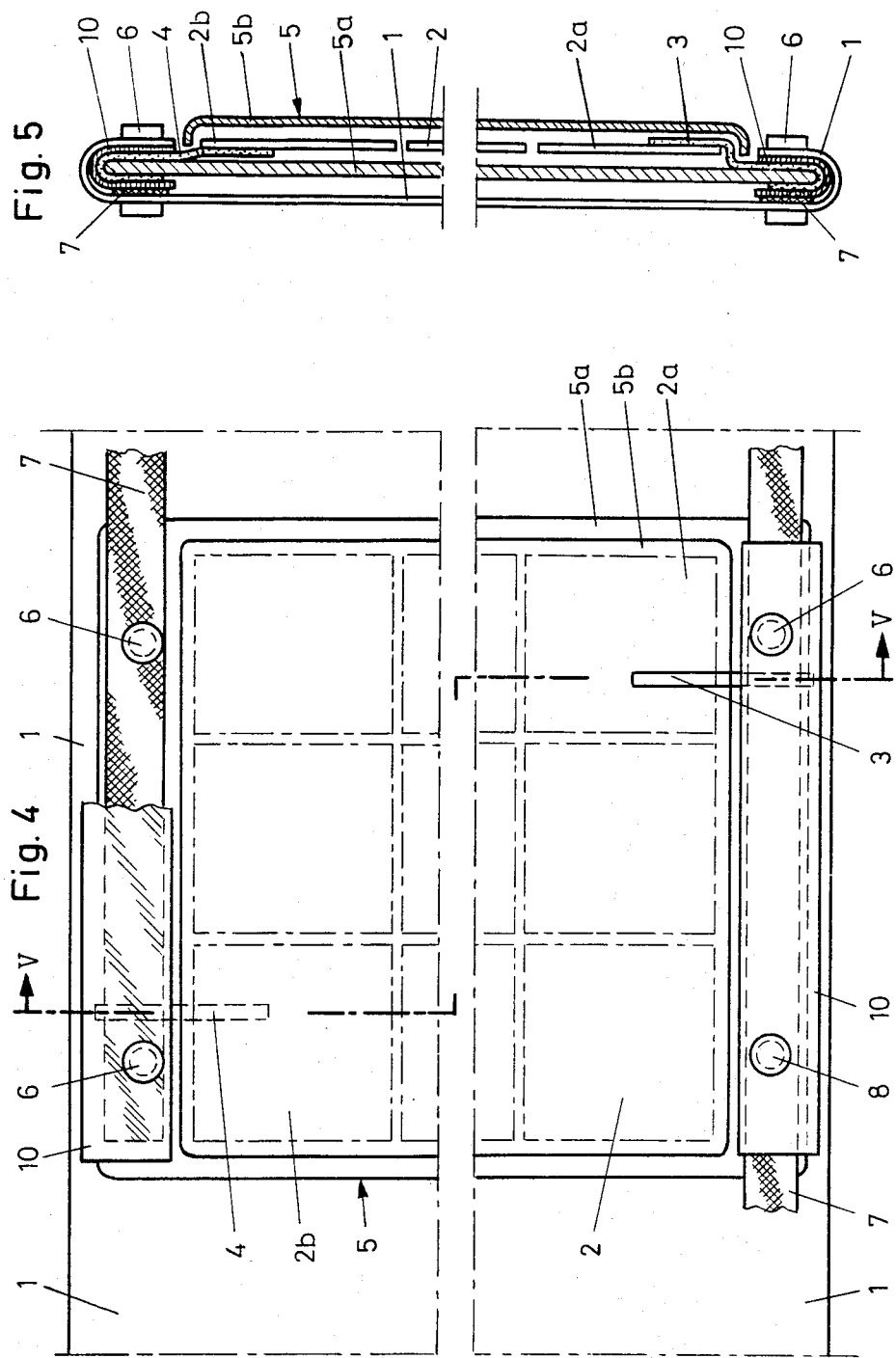

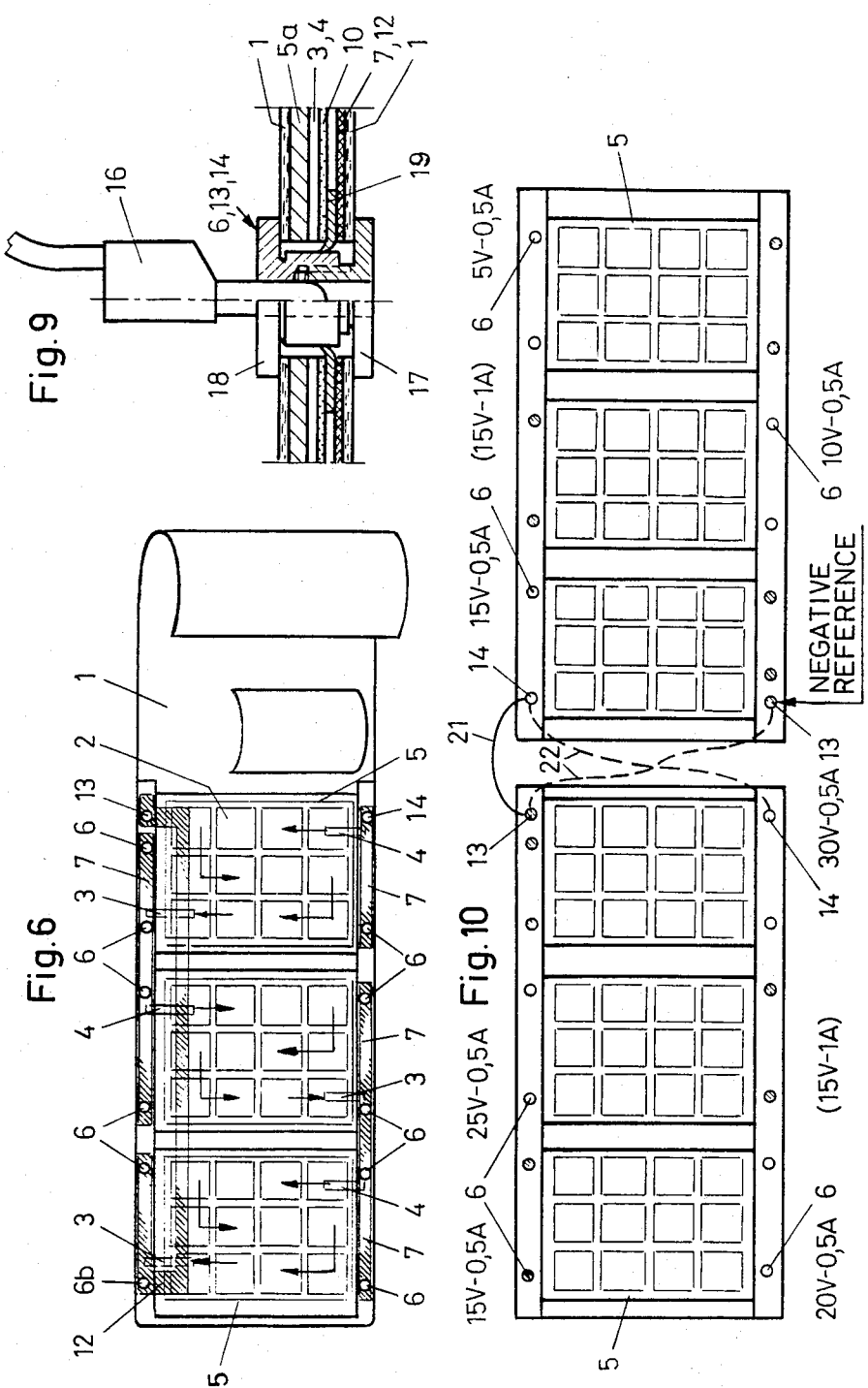

Fig. 8 Fig. 7
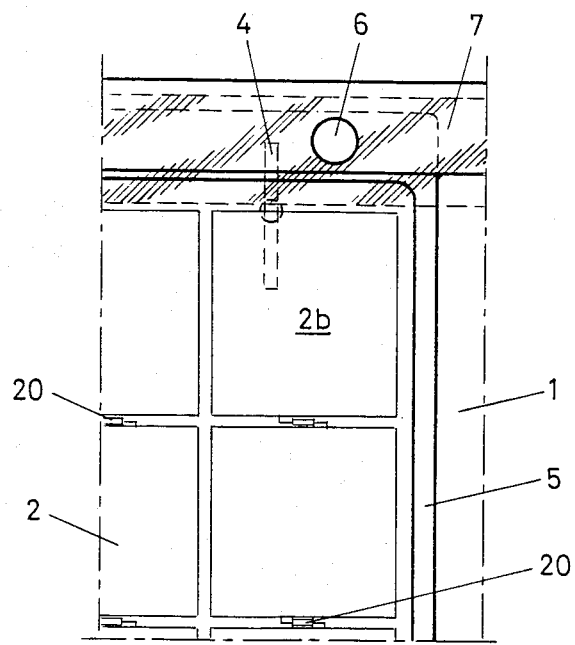
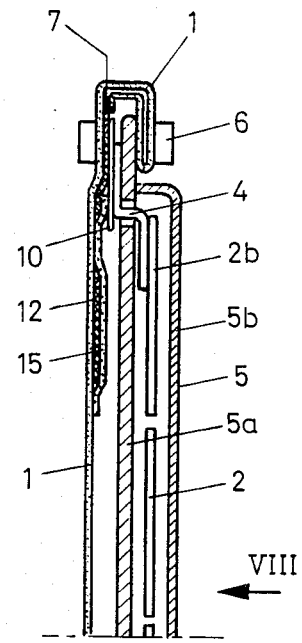
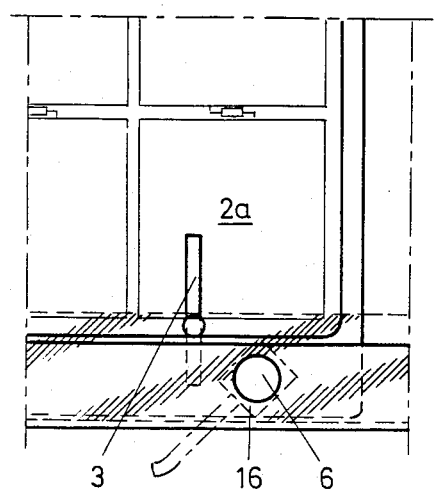
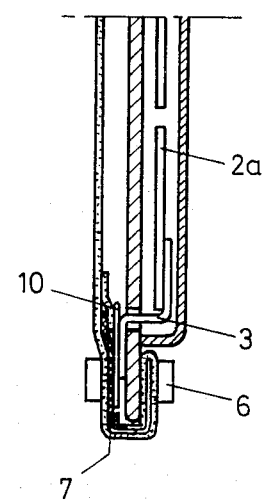

SYSTEM WITH SEVERAL PANELS CONTAINING PHOTOELECTRIC ELEMENTS FOR THE PRODUCTION OF ELECTRIC CURRENT

This invention relates to a system with several panels containing electrically interconnected photoelectric elements for the production of electric current.

Such panels are known in numerous embodiments with a varying number of photoelectric elements. Depending on the number of elements and their hookup, one panel by action of light provides a maximum electric output at a specific voltage and a specific current.

In many cases when such panels are used, a voltage or current delivery is desired which exceeds the capacity of a single panel several times over. Consequently, several panels are electrically interconnected in series and/or parallel connection; however, adversely complicated cable connections susceptible to breakdown are necessary, which, moveover, make transporting the interconnected panels at least considerably more difficult if not impossible.

This invention aims at creating a system of the kind indicated in the beginning, in which several panels are connected without using wires, convenient transportation of the connected panels is made possible and the panels of the system can be replaced without using wires.

To achieve this aim, the system according to the invention displays the features cited in the characteristic pair of claim 1.

Embodiments of the object of the invention are explained below on the basis of the accompanying drawings.

FIG. 1 displays a diagrammatic section through a repeatedly folded pocket into which panels with photoelectric elements have been inserted;

FIG. 4 is a top view on a larger scale of the area of a panel of the compartmented folding pocket of FIG. 2 or 3 with details of the electrical connection elements;

FIG. 5 is a section along the V—V line in FIG. 4;

FIG. 6 is a top view of an opened compartmented folding pocket with three panels containing photoelectric elements in another embodiment;

FIG. 7 is a section on a larger scale through the compartmented folding pocket of FIG. 6;

FIG. 8 is a top view on a larger scale of part of the compartmented folding pocket of FIG. 6 according to arrow VIII in FIG. 7;

FIG. 9 is a section through a contact socket of the compartmented folding pocket of FIG. 6;

FIG. 10 is a diagrammatic representation of two series or parallel connected compartmented folding pockets according to FIG. 6.

Figure 1:
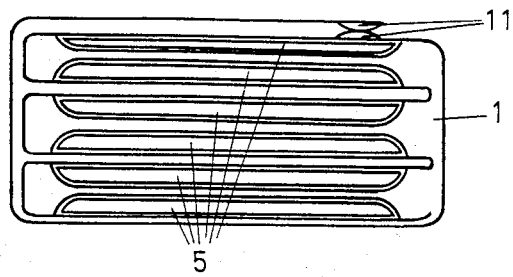

As is evident from FIG. 1, this system provides a compartmented folding pocket 1 from a width of material made of flexible insulating material, e.g., a width of plastic. The width of the compartmented folding pocket 1 in its longitudinal direction at intervals is provided with several, namely six, panels 5, which consist of a sizable number of photoelectric elements that are electrically interconnected. As is also evident from FIG. 1, the individual sections of the width of the compartmented folding pocket 1 containing a panel each are folded in a zigzag pattern in the transport or storage condition of this system, whereby clamping locks or Velcro strip fasteners 11 have closed the compartmented folding pocket 1, so that it can be conveniently and safely transported or stored.

Figure 2:
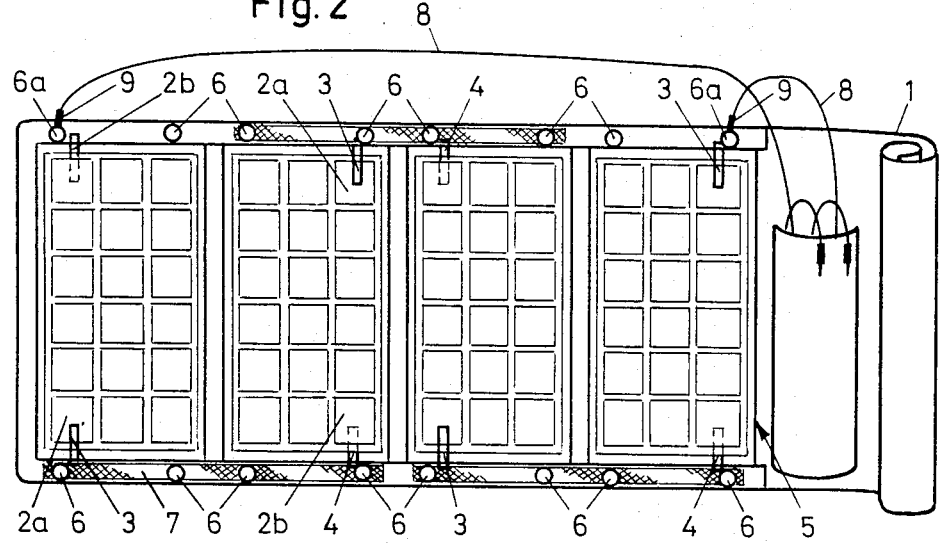
FIG. 2 is a top view of an opened compartmented folding pocket with four panels containing photoelectric elements, whereby the panels are connected in series.
Figure 3:
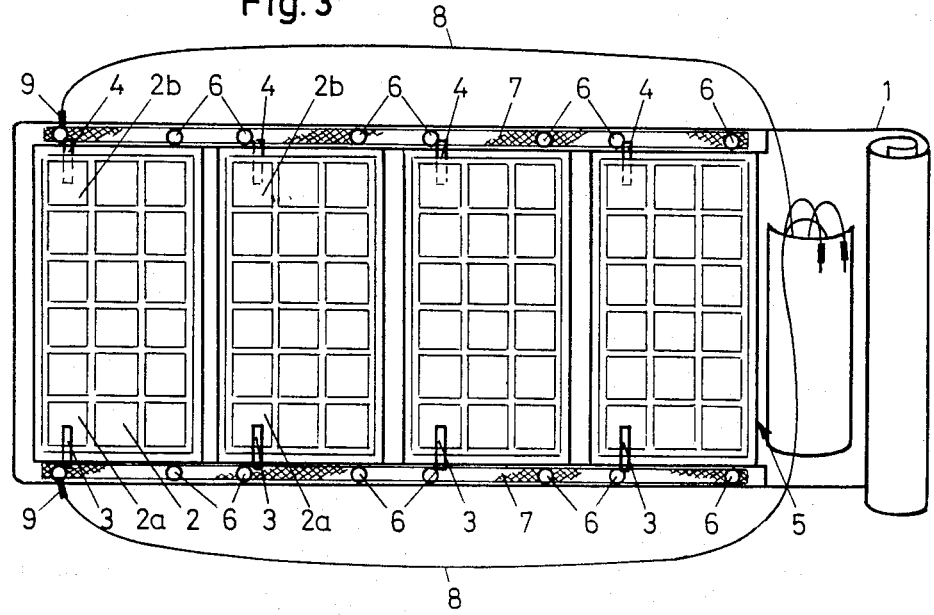
FIG. 3 is a top view of an opened compartmented folding pocket with four panels containing photoelectric elements, whereby the panels are connected in parallel.

In FIGS. 2 and 3, the top view of an opened compartmented folding pocket 1, which contains four panels, is shown. In the presented embodiments, every panel 5 consists, in a manner known in the art, of a sizable number of individual photoelectric elements 2, which, in a manner also known in the art, are electrically connected in series and parallel or—more rarely—parallel. One terminating element 2a and 2b each hereby form the negative and positive terminating or connection element, respectively, of panel 5. As tapping points for the voltage or the electric current of said panel 5, metal strips constructed as solder strips 3 and/or 4 are attached to the terminating elements 2a and 2b; the metal strips are conductive on the surface or underside, respectively, of the terminating elements 2a, 2b. These metal strips extend from the respective terminating element of each panel 5 to the adjoining longitudinal edge of the compartmented folding pocket 1. Hereby, the solder strips connected to the terminating elements 2a with negative polarity are identified as 3 and solder strips connected to the terminating elements 2b with positive polarity are identified as 4. In the following they are identified as negative solder strip 3 or positive solder strip 4.

As is evident from FIGS. 2 and 3, the individual panels 5 are arranged with intervals in the longitudinal direction of the compartmented folding pocket 1 to make possible folding of the compartmented folding pocket 1 as per FIG. 1. For electrical interconnection of the panels, connection strips 7 in electrical contact with the panels have been arranged in the longitudinal direction of the compartmented folding pocket 1 along its two longitudinal edges with contact elements 6. These connection strips consist of a highly flexible metal fabric, e.g., a nonferrous metal fabric of fine mesh size, and are incorporated in the material of the compartmented folding pocket 1. The negative and positive solder strips 3 and 4 of the panels 5 are connected to the connection strips 7 in a specific manner explained by FIGS. 4 and 5.

In the embodiment of FIG. 2, the connection strips 7 of panels 5 are so arranged in the compartmented folding pocket that a series connection of the individual panels 5 is achieved. In this method of connection, the voltage of a single panel 5 is multiplied by the number of panels arranged in the compartmented folding pocket 1, whereby the total current remains the same as for an individual panel.

In the embodiment of FIG. 3, the panels 5 are parallel connected by the connection strips 7, so that in this method of connection the current of a single panel 5 is multiplied by the number of panels arranged in the compartmented folding pocket 1, whereby the total voltage corresponds to that of an individual panel.

The current tapping of the systems shown in FIGS. 2 and 3 occurs by way of cables 8, which, e.g., are connected by means of cable terminals 9 in the embodiment of FIG. 2 to two contact elements 6a corresponding to the total voltage or for tapping of partial voltage to two contact elements 6 in contact with the connection strips 7. In the embodiment of FIG. 3, the cable terminals 9 can be connected to any contact elements 6 in contact with the connection strips 7.

From FIG. 4 it is evident that to connect the negative solder strip 3 and the positive solder strip 4 with the corresponding connection strip 7 incorporated in the compartmented folding pocket 1 and consisting of metal fabric, the solder strip 3 or 4 concerned is in electrical contact with a busbar 10, which is maintained in electrical contact by the respective connection strip 7. This arrangement, together with the material width of the compartmented folding pocket 1 into which the connection strips have been incorporated and with a carrier plate 5a of panel 5, is held together by means of contact elements 6.

The cross section of FIG. 5, makes it evident that panel 5 contains the said carrier plate 5a, the electrically interconnected photoelectric elements 2, and a transparent covering plate 5b. The solder strips 3 and 4 connected with the terminating elements 2a and 2b, respectively, are placed on the longitudinal edges of the carrier plate 5a up to the latter's backside. The busbars 10 also comprise the longitudinal edges of the carrier plate 5a and accordingly have a U-shaped profile. The backside of the carrier plate 5a is covered by the material width of the compartmented folding pocket 1, which extends over the connection strips 7 and the busbar 10 and is shown cut open in FIG. 4 over busbars 10. Thus the connection strips 7 incorporated in the compartmented folding pocket 1 rest on one leg shank of the busbars 10. The contact elements 6 hold the layer structure together, whereby the contact elements 6, as indicated in FIG. 4, may be screw or also snap-fastener connections which are not shown.

The described system has the principal advantage that it does not require any wires, except for a pair of connecting cables, for electrical connection of several, principally any number of, panels with photoelectric elements and that by simple folding of the compartmented folding pocket from the open, spread-out operating condition it can be changed into a compact, convenient transport or storage form without having to take apart or remove any connecting element.

Moreover, a significant advantage consists in the fact that the panels can be easily installed in or removed from the compartmented folding pocket, for which purpose merely the contact elements of the panel concerned are to be put in or removed; however, no other connecting processes, such as soldering or fastening of cables are to be carried out. Thus the compartmented folding pockets with the incorporated connection strips can be produced separately in varying lengths and, if need be, interrupted or as continuous connection strips (series or parallel connection of the inserted panels), whereby then, aside from the panels, only the uniform-length busbars and the uniform contact elements are required for the production of a photoelectric electric-current production facility. This system is suitable as a series product, especially for mobile applications with optionally different requirements for output voltage and electric current.

A further embodiment of the system according to the invention is shown in FIG. 6, which is similar to the embodiments of FIGS. 2 and 3. Here identical parts are identified with the reference numerals of FIGS. 2 and 3.

The panels 5 containing photoelectric elements 2 inserted in the compartmented folding pockets 1 are again electrically connected via negative solder strips 3 and positive solder strips 4 with connection strips 7 extending in longitudinal direction of the compartmented folding pocket 1 and consisting of flexible metal fabric. The connection strips 7 are incorporated into this width of material of the compartmented folding pocket 1. Hereby the connection strips 7 on alternate sides extend in each case over two panels 5 arranged side by side, with reverse polarities, so that a series connection of the panels 5 is achieved by the connection strips 7. On the panels 5, the directions of current flow are indicated in each case by arrows. As already described based on FIGS. 2 to 5 for the mechanical connection of the panels 5 with the compartmented folding pocket 1 and its electrical connection with the connection strips 7, contact elements 6 are planned that are developed as screw or snap-fastener connections, which can also serve to connect a consumer to this system via cable.

In the embodiment of FIG. 6, an additional connection strip 12 has been incorporated into the material of the compartmented folding pocket 1, which extends below panels 5 over the entire length of the area of the compartmented folding pocket 1 provided with panels 5. At one end there is the connection strip 12 in electrical connection with contact element 6b, which forms the negative pole of the series connection of the panels 5. At the other end, the connection strip leads to a separate contact element 13. Contact element 13 and a similar contact element 14 in crosswise direction across, which forms the positive pole of the series connection of the panels 5 accordingly are the two terminal clamps of the shown system, the clamps on which the total voltage of all panels 5 lies. Because of the fact that the connecting contact elements 13, 14 are now across from one another in crosswise direction to the compartmented folding pocket 1, the electrical connections of several systems according to FIG. 6 can be made in an especially simple and easy manner, as will be explained in more detail by means of FIGS. 10 to 13.

Details of the construction of the system of FIG. 6 emerge from FIGS. 7 and 8. FIG. 7 makes it evident that panel 5 again has a carrier plate 5a, several photoelectric elements 2 and a transparent covering plate 5b. The respective photoelectric terminating elements 2a (negative) and 2b (positive) are provided with solder strips 3 and 4, respectively, which through openings in the carrier plate 5a, run along its backside. The connection strips 7 and the additional connection strip 12 are incorporated into the material of the compartmented folding pocket 1 in overlappings of the compartmented folding pocket material and/or in a separate pocket 15, whereby the compartmented folding pocket material extends over the edge area of the carrier plate 5a. Between the carrier plate 5a and the connection strips 7 strip-shaped busbars 10 are arranged which thus are in electrical contact with the solder strips 3, 4 and the connection strips 7. This layer structure is mechanically and electrically held together by the contact elements 6.

Contact elements 6 and especially the connecting contact elements 13 and 14 of FIG. 6 can be advantageously designed as receptacles of plug contacts, e.g., banana plugs. In FIG. 9 a contact element is shown that accommodates a banana plug which is also indicated in FIG. 8. The contact element consists of two flange parts 17 and 18 that can be screwed together, between which the layer structure of the material of the compartmented folding pocket 1, the carrier plate 5a of the respective panel, the solder strip 3 or 4, respectively, the busbar 10, the connection strip 7 or 12 and again the material of the compartmented folding pocket is clamped in. Between the busbar 10 and the connection strips 7 or 12, a contact spring 19 of known design is arranged to ensure the flow of the current between the busbar 10, the connection strip 7 or 12 and the contact element 6 or 13 or 14.

In addition, FIG. 8 makes it evident that the individual series-connected photoelectric elements 2 of panel 5 are interconnected by diodes 20 as per the directions of the current flow indicated by arrows in FIG. 6. As a result, in case of damage to a photoelectric element 2 the output of the respective panel is reduced only by the output drop of the damaged element 2, so that there is no loss of a whole element series or of the entire panel, as happens with known panels. Because of the forward flow of the current, practically no voltage losses occur for intact photoelectric elements 2 because of the protective diodes 20.

In the system shown in FIG. 6, the three panels 5 inserted into the compartmented folding pocket 1 are series connected through the connection strips 7 and 12. But it is also possible to operate these systems in a parallel connection of the panels 5 by simply bridging the interruption of connection strips 7 existing at each longitudinal edge of the compartmented folding pocket by means of a flexible conductor connected to one of the adjoining contact elements 6. Between the connecting contact elements 13 and 14, a total electric current at the voltage of a single panel 5 can be tapped which is three times as large as that of one panel 5.

FIG. 10 diagrammatically shows how two systems according to FIGS. 6 can be interconnected to achieve a higher current tapping by simple means in an easy-to-grasp manner. In the one case, the negative connecting contact element 13 of the one system is connected with the positive connecting contact element 14 of the other system by means of cable 21 provided with banana plugs. Between the positive connecting contact element 14 of the first mentioned system and the negative connecting contact element 13, serving as negative reference point, of the second system, the full series voltage of the two systems can be tapped with the current output of a single panel 5. Between the cited negative reference point of contact element 13 and the additional contact elements 6 of both systems, partial voltages can moreover be tapped as indicated in FIG. 10 by corresponding voltage and electric current values. In this connection, it is assumed that each panel 5 produces an 0.5 A current at a voltage of 5 V.

Parallel connection of both systems is attained by two plug-in cables 22, shown by broken lines, which in each case connect both connecting contact elements 13 and 14, respectively. With appropriate contact elements 6, double the amount of electric current (here 1 A) can be tapped at the voltage of a system (here 15 V), which is indicated in FIG. 10 by voltage and electric current values in parentheses.

Figure 11:
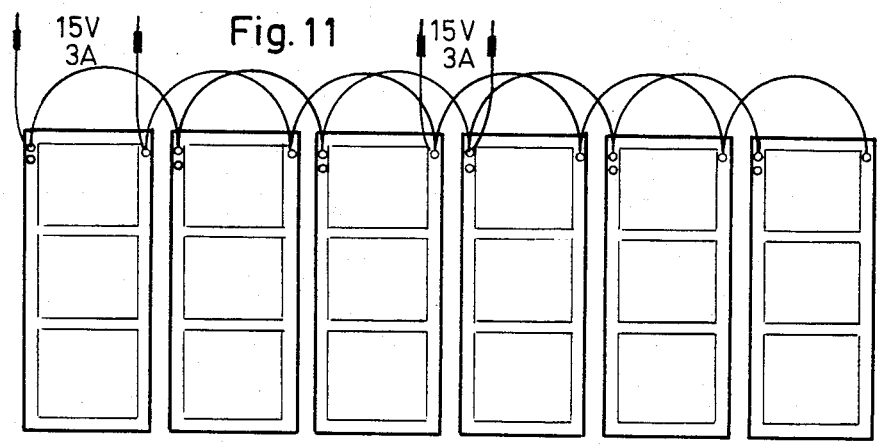
FIGS. 11 to 13 are diagrammatically different possibilities for connections of six compartmented folding pockets each according to FIG. 6.
Figure 12:
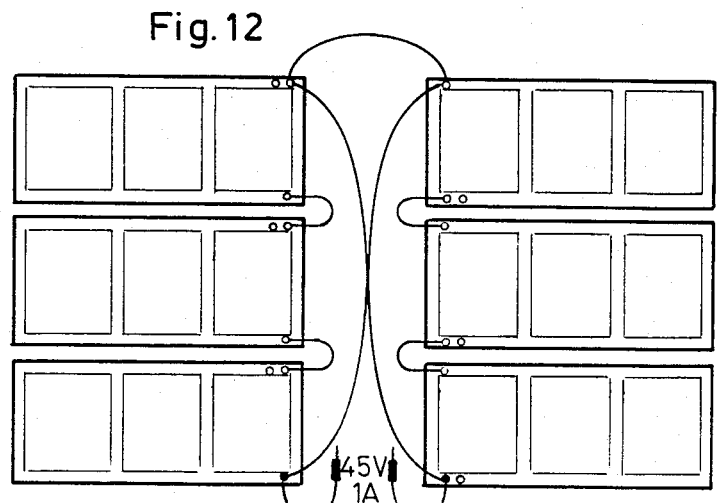
Figure 13:
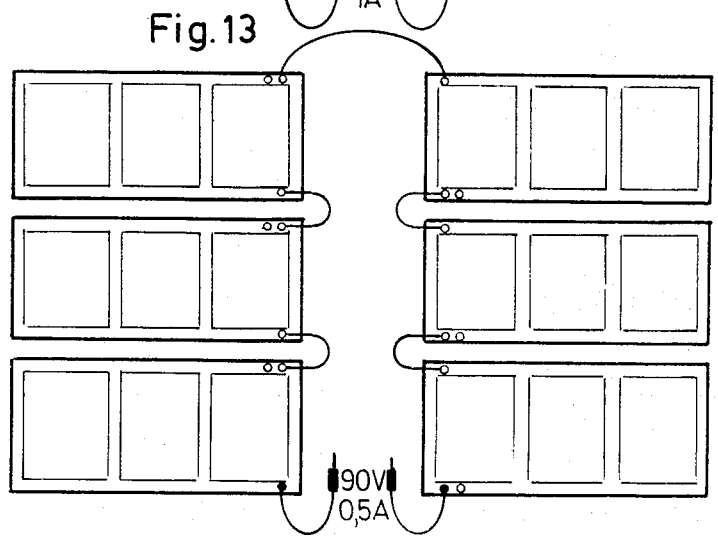

Further possibilities for connections of a sizable number of systems according to FIG. 6 are diagrammatically shown in FIGS. 11 to 13, whereby in each case six such systems are interconnected by means of plug-in cables in parallel connection (FIG. 11), in series-parallel connection (FIG. 12) and in series connection (FIG. 13). As shown in FIGS. 11 to 13, under the assumption that each panel produces a current of 0.5 A at 5 V, in this manner the following outputs can be achieved:

In this situation, the cable connections remain easy-to-read and optionally short.

Arrangements of this kind in most cases are operated jointly with electronic control switches to regulate voltage and electric current and with buffer batteries. It is advantageously possible without any further ado to install such control switches, insulated, into the shown compartmented folding pocket, preferably in pancake design and to connect them by open or protected and flexible conductors integrated into the compartmented folding pocket with the contact elements of the panels or directly with the connection strips of the panels. But it is also possible to install into this compartmented folding pocket buffer batteries adapted to the electrical output of this system which are known in the pancake construction method, so that as external connections, only the conductors leading to the consumer are present.

We claim:

1. System with several panels containing electrically interconnected photoelectric elements for the production of electric current, characterized in that the panels are arranged side by side in a compartmented folding pocket open on one side and have an interval between adjoining panels to form at least one folding position, the panels are electrically connected in series and/or parallel connection by means of flexible conductors incorporated into the compartmented folding pocket and extending at least in part over the folding positions and that connection devices are present to connect the panels mechanically with the conductors and the compartmented folding pocket and to tap voltages and/or electric currents from the conductors.

2. System as in claim 1, wherein the flexible conductors are flexible metal fabrics.

3. System as in claim 1 wherein each panel is provided with two contact strips or tapes arranged on opposite sides of the panel, which are in electric contact with a flexible conductor incorporated into each longitudinal edge of the compartmented folding pocket.

4. System as in claim 3, wherein the connecting devices are contact elements which by means of a contact bar press each contact strip of the panel onto the flexible conductor incorporated into the compartmented folding pocket and hold it in place in the compartmented folding pocket.

5. System as in claim 4, wherein the contact elements are screw connections.

6. System as in claim 4, wherein the contact elements are snap-fastener connections.

7. System as in claim 4, wherein the contact elements are formed to accept cable terminals or plug contacts.

8. System as in claim 7, wherein the plug contacts comprise banana plugs.

9. System as in claim 1, wherein for the formation of a series connection of the panels, the latter are arranged side by side in the compartmented folding pocket with alternating polarity and the flexible conductors in segments extend from one panel to the adjoining panel.

10. System as in claim 1, wherein for the formation of a parallel connection of the panels the latter are arranged side by side in the compartmented folding pocket with identical polarity and the flexible conductors extend over all panels.

11. System as in claim 1, wherein an additional flexible conductor is incorporated into the compartmented folding pocket, which extends over all panels, on its one end is connected with a terminal connection of a first panel and at its other end with a contact element that is arranged insulated near a terminal connection of the last panel.

12. System as in claim 1, wherein the compartmented folding pocket contains an electronic control switch electrically connected to the panels, preferably in pancake design, to regulate the tapped voltage and/or the tapped electric current.

13. System as in claim 1, wherein the compartmented folding pocket contains at least one flat buffer battery.

* * * * *